(12) United States Patent
Tseng et al.

(10) Patent No.: US 8,829,338 B2
(45) Date of Patent: Sep. 9, 2014

(54) BRIDGING SOLAR CELL AND SOLAR ENERGY SYSTEM

(71) Applicant: AU Optronics Corp., Hsinchu (TW)

(72) Inventors: Huang-Chi Tseng, Hsin-Chu (TW); Chun-Ming Yang, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 6 days.

(21) Appl. No.: 13/659,114

(22) Filed: Oct. 24, 2012

(65) Prior Publication Data
US 2013/0312807 A1    Nov. 28, 2013

(30) Foreign Application Priority Data
May 24, 2012    (CN) .......................... 2012 1 0165275

(51) Int. Cl.
| | | |
|---|---|---|
| *H02N 6/00* | (2006.01) | |
| *H01L 31/00* | (2006.01) | |
| *H01L 31/042* | (2014.01) | |
| *H01L 31/0224* | (2006.01) | |
| *H01L 31/05* | (2014.01) | |
| *H01L 27/142* | (2014.01) | |

(52) U.S. Cl.
CPC .... *H01L 31/022433* (2013.01); *H01L 31/0504* (2013.01); *H01L 31/0508* (2013.01); *H01L 27/1426* (2013.01)
USPC .......................................... 136/256; 136/244

(58) Field of Classification Search
CPC ................... H01L 31/022433; H01L 31/0504; H01L 31/0508; H01L 27/1426
USPC .................................................. 136/244, 256
See application file for complete search history.

(56) References Cited

U.S. PATENT DOCUMENTS

| | | | |
|---|---|---|---|
| 4,513,167 A * | 4/1985 | Brandstetter ................. | 136/244 |
| 2011/0017279 A1 | 1/2011 | Baumbach et al. | |
| 2011/0067751 A1 | 3/2011 | Meakin et al. | |

FOREIGN PATENT DOCUMENTS

| | | |
|---|---|---|
| CN | 101980370 A | 2/2011 |
| CN | 102005493 A | 4/2011 |

* cited by examiner

*Primary Examiner* — Eli Mekhlin
(74) *Attorney, Agent, or Firm* — WPAT, PC; Justin King

(57) ABSTRACT

A bridging solar cell includes a substrate, first, second, and third sets of bus bar electrodes, a first welding member, a first insulation film, and a second welding member. The first set of bus bar electrodes is disposed on the front surface of the substrate along a first direction. The second set of bus bar electrodes is disposed on the back surface of the substrate along a second direction and electrically connected to the first set of bus bar electrodes. The first welding member is electrically connected to the second set of bus bar electrodes. The first insulation film is disposed on the back surface. The third set of bus bar electrodes is disposed on the first insulation film along the second direction. The second welding member is disposed on the first insulation film and electrically connected to the third set of bus bar electrodes.

14 Claims, 6 Drawing Sheets

BRIDGING SOLAR CELL AND SOLAR ENERGY SYSTEM

RELATED APPLICATIONS

This application claims priority to Chinese Application Serial Number 201210165275.1, filed May 24, 2012, which is herein incorporated by reference.

BACKGROUND

1. Technical Field

The present disclosure relates to a bridging solar cell and a solar energy to system.

2. Description of Related Art

Owing to the shortage of fossil fuels, awareness of the importance of environmental protection is increasing. Therefore, many have been actively developing technologies related to alternative energy and renewable energy in recent years, with the hope that the dependence on fossil fuels and the impact on the environment caused by using fossil energy can be reduced. Among the various kinds of technologies related to alternative energy and renewable energy, the solar cell is a technology that is receiving much attention. The reason for the interest in this technology is that solar cells can directly convert solar energy into electricity, and carbon dioxide or other harmful substances such as nitrogen compounds are not produced during the process of power generation, so that the environment will not be polluted.

Silicon is the most important and widely used material in the semiconductor industry. Today, the technologies behind the production and supply of silicon wafers are already at a quite mature stage. The energy gap of silicon is suitable for absorbing sunlight, and it is for at least this reason that silicon solar cells have become the most widely used solar cells. Generally, a monocrystalline silicon solar cell or a polycrystalline silicon solar cell includes the layers of an external electrode, an anti-reflective layer, an n-type semiconductor layer, and a p-type semiconductor layer.

A common solar energy system includes a plurality of solar cell modules and an inverter. Each of the solar cell modules includes a plurality of solar cells that are connected to each other in series, and each of the solar cell modules uses a junction box to electrically connect to another junction box of another solar cell module. In general, the solar cells included in the solar energy system that are electrically connected to the inverter in series can be arranged in a single row or two rows.

However, when the solar cells included in the solar energy system are arranged in a single row, the solar cell modules farthest from the inverter must be electrically connected back to the inverter using a long cable, and the long cable needs to be accommodated in an additional hollow pipe. As a result of this configuration, the power loss and material costs of the whole solar energy system are increased.

Furthermore, a common layout in a present solar cell module (especially a solar cell module including at least 60 solar cells) is that in which four bussing ribbons and three bussing ribbons are respectively disposed at a region adjacent to the upper edge and a region adjacent to the lower edge of a glass substrate of the solar cell module, and the four and three bussing ribbons realize external electrical connection (i.e., to another solar cell module) respectively from the center portion of the region adjacent to the upper edge and the center portion of the region adjacent to the lower edge. Therefore, both the regions respectively adjacent to the upper and lower edges of the glass substrate need space to arrange the bussing ribbons, and this results in an increase in the usage of related materials. Furthermore, a junction box used in the solar cell module is located at the center of the solar cell module, and so the total length of the used cables is significant when all the solar cell modules in the solar energy system are electrically connected in series. Ultimately, energy loss will be adversely affected.

SUMMARY

In order to solve the problems of the prior art, the disclosure provides an improved bridging solar cell. Particularly, the direction along which bus bar electrodes are disposed on a back surface (which is referred to also as a shadow-side surface in the disclosure) of the bridging solar cell is different from the direction along which bus bar electrodes are disposed on a front surface (which is referred to also as an incident light-side surface in the disclosure) of the bridging solar cell. Therefore, the foregoing bridging solar cell can be used to electrically connect two solar cell strings in a solar cell module. The bus bar electrodes on the back surface of the bridging solar cell can be directly extended onto a front surface of another bridging solar cell in another solar cell string and act as the bus bar electrodes on the front surface of the another bridging solar cell, and so it is unnecessary to electrically connect the solar cell module to an external element (i.e., to another solar cell module) using bussing ribbons disposed at a region adjacent to an upper edge and a region adjacent to a lower edge of a glass substrate of the solar cell module. Accordingly, not only can the area of the glass substrate of the solar cell module be reduced, but the total length of the used bussing ribbons in the solar cell module can also be reduced, so as to achieve the advantages of saving costs of related materials and minimizing energy loss.

According to an embodiment of the disclosure, a bridging solar cell includes a substrate, a first set of bus bar electrodes, a second set of bus bar electrodes, a first welding member, a first insulation film, a third set of bus bar electrodes, and a second welding member. The substrate has a front surface and a back surface. The first set of bus bar electrodes is disposed on the front surface along a first direction. The second set of bus bar electrodes is disposed on the back surface along a second direction different from the first direction and electrically connected to the first set of bus bar electrodes via the substrate. The first welding member is electrically connected to the second set of bus bar electrodes. The first insulation film is disposed on the back surface. The third set of bus bar electrodes is disposed on the first insulation film along the second direction so as to be insulated from the substrate. The second welding member is disposed on the first insulation film and electrically connected to the third set of bus bar electrodes.

In an embodiment of the disclosure, the bridging solar cell further includes a second insulation film. The second insulation film is disposed on the first insulation film and covers a portion of the second welding member. A portion of the first welding member is extended onto the second insulation film and insulated from the second welding member by the second insulation film.

In an embodiment of the disclosure, the portion of the first welding member extended onto the second insulation film and the portion of the second welding member covered by the second insulation film are respectively located at two opposite surfaces of the second insulation film.

In an embodiment of the disclosure, the first insulation film has a protruding portion. The protruding portion protrudes outwardly from an edge of the back surface. The third set of bus bar electrodes is extended away from the first insulation film from the protruding portion.

In an embodiment of the disclosure, the first welding member includes a coupling portion and a terminal portion. The coupling portion is coupled to the second set of bus bar electrodes. The terminal portion is connected to the coupling portion. The coupling portion and the terminal portion form an L-shaped structure or a T-shaped structure.

In an embodiment of the disclosure, the second welding member includes a coupling portion and a terminal portion. The coupling portion is coupled to the third set of bus bar electrodes. The terminal portion is connected to the coupling portion. The coupling portion and the terminal portion form an L-shaped structure or a T-shaped structure.

The disclosure further provides an improved solar energy system. Particularly, the direction along which two sets of bus bar electrodes are disposed on a back surface of a bridging solar cell is different from the direction along which bus bar electrodes are disposed on a front surface of the bridging solar cell. Therefore, one set of bus bar electrodes on the back surface of a bridging solar cell of a solar cell string of a solar cell module can be directly extended onto a front surface of another bridging solar cell in another solar cell string of the solar cell module and act as the bus bar electrodes on the front surface of the another bridging solar cell when the solar cell strings are made to be electrically connected in series. Moreover, another set of bus bar electrodes on the back surface of the bridging solar cell of the solar cell string of the solar cell module can be electrically connected to another bridging solar cell in another solar cell module by using welding members and a junction box. Accordingly, not only can the area of the glass substrate of the solar cell module be reduced, but the total length of the used bussing ribbons in the solar cell module can also be reduced, so as to achieve the advantages of saving costs of related materials and minimizing energy loss.

According to an embodiment of the disclosure, a solar energy system includes a plurality of solar cell modules. Each of the solar cell modules includes a first solar cell string and a junction box. The first solar cell string includes a plurality of first solar cells and a first bridging solar cell. The first solar cells and the first bridging solar cell are connected in series along a first direction. The first bridging solar cell includes a substrate, a first set of bus bar electrodes, a second set of bus bar electrodes, a first welding member, a first insulation film, a third set of bus bar electrodes, and a second welding member. The substrate has a front surface and a back surface. The first set of bus bar electrodes is disposed on the front surface along the first direction. The second set of bus bar electrodes is disposed on the back surface along a second direction different from the first direction and electrically connected to the first set of bus bar electrodes via the substrate. The first welding member is electrically connected to the second set of bus bar electrodes. The first insulation film is disposed on the back surface. The third set of bus bar electrodes is disposed on the first insulation film along the second direction so as to be insulated from the substrate. The second welding member is disposed on the first insulation film and electrically connected to the third set of bus bar electrodes. The junction box is electrically connected to the first welding member and the second welding member. The junction box of each of the solar cell modules is electrically connected to another junction box of another adjacent solar cell module.

In an embodiment of the disclosure, each of the solar cell modules further includes a second solar cell string. The second solar cell string includes a plurality of second solar cells and a second bridging solar cell. The second solar cells and the second bridging solar cell are connected in series. The second bridging solar cell includes a substrate. The substrate of the second bridging solar cell has a front surface. The third set of bus bar electrodes is extended onto the front surface of the substrate of the second bridging solar cell.

In an embodiment of the disclosure, the junction box is disposed on the back surface.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
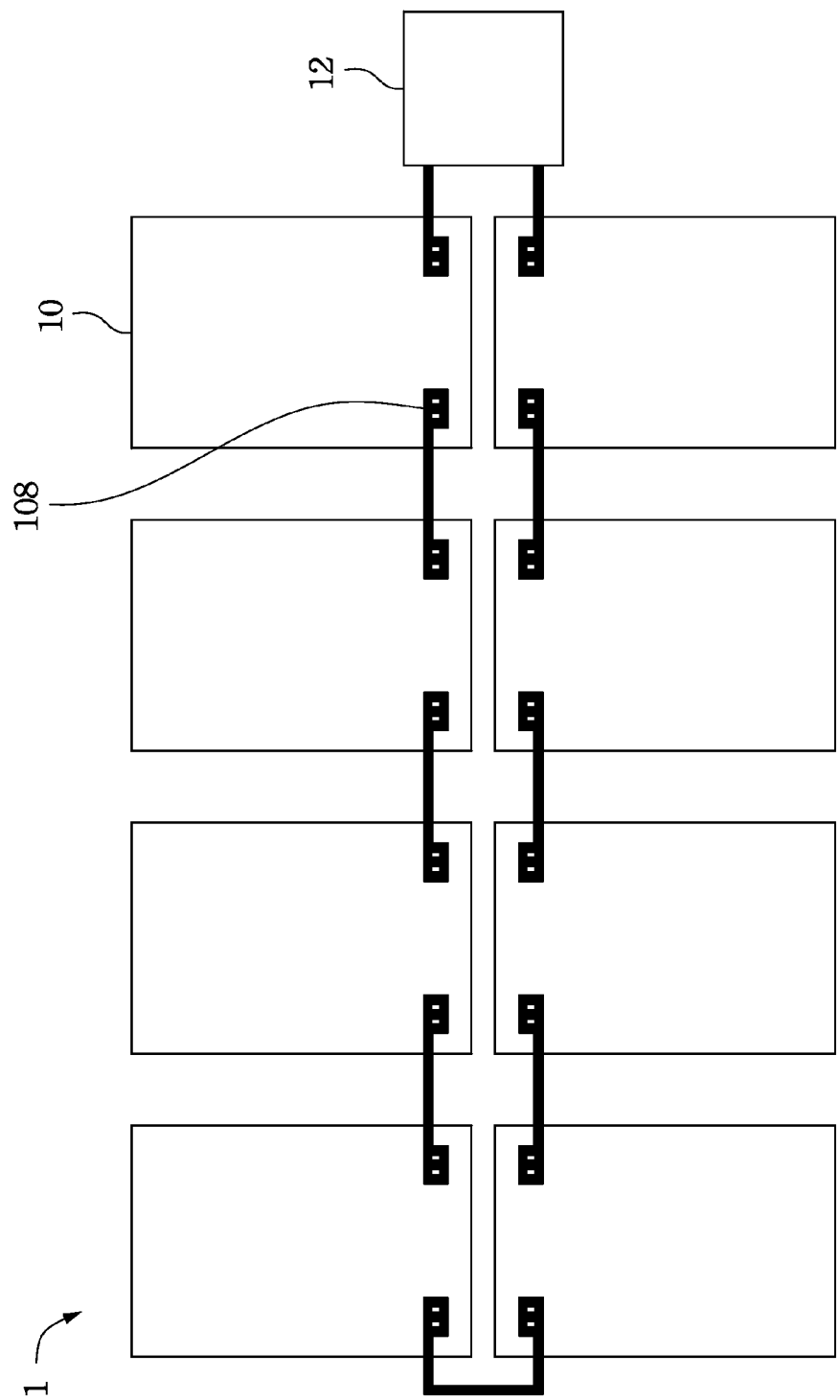
FIG. 1 is a schematic diagram of a solar energy system according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

An improved solar energy system is provided. Particularly, the direction along which two sets of bus bar electrodes are disposed on a back surface of a bridging solar cell is different from the direction along which bus bar electrodes are disposed on a front surface of the bridging solar cell (e.g., the direction along which the sets of bus bar electrodes are disposed on the back surface of a bridging solar cell is perpendicular to the direction along which the bus bar electrodes are disposed on the front surface of the bridging solar cell). One set of bus bar electrodes on the back surface of a bridging solar cell of a solar cell string of a solar cell module can be directly extended onto a front surface of another bridging solar cell in another solar cell string of the solar cell module and act as the bus bar electrodes on the front surface of the another bridging solar cell when the solar cell strings are made to be electrically connected in series. Moreover, another set of bus bar electrodes on the back surface of the bridging solar cell of the solar cell string of the solar cell module can be electrically connected to another bridging solar cell in another solar cell module by using welding members and a junction box.

FIG. 1 is a schematic diagram of a solar energy system 1 according to an embodiment of the disclosure.

As shown in FIG. 1, the solar energy system 1 includes a plurality of solar cell modules 10 and an inverter 12. The solar cell modules 10 of the solar energy system 1 are arranged in two rows from the inverter 12 substantially along a direction. The positive and negative terminals of the inverter 12 of the solar energy system 1 are respectively connected to the two rows of the solar cell modules 10, and the two solar cell modules 10 farthest from the inverter 12 respectively in the two rows of the solar cell modules 10 are coupled to each other so as to form a complete loop. Furthermore, each of the solar cell modules 10 of the solar energy system 1 includes junction boxes 108. The junction boxes 108 of any of the solar cell modules 10 in each row of the solar cell modules 10 (excluding the solar cell modules 10 at the ends of the rows) can be electrically connected to the junction boxes 108 of the solar cell modules 10 adjacent thereto. It is noted that the junction boxes 108 of the solar cell module 10 at the end of each row and adjacent to the inverter 12 are connected respectively to the inverter 12 and one of the junction boxes 108 of the adjacent solar cell module 10 in the same row, and the junction boxes 108 of the solar cell module 10 at the end of each row and farthest from the inverter 12 are connected respectively to one of the junction boxes 108 of the adjacent solar cell module 10 in the same row and to one of the junction boxes 108 of the other solar cell module 10 farthest from the inverter 12 in the adjacent row.

Figure 2:
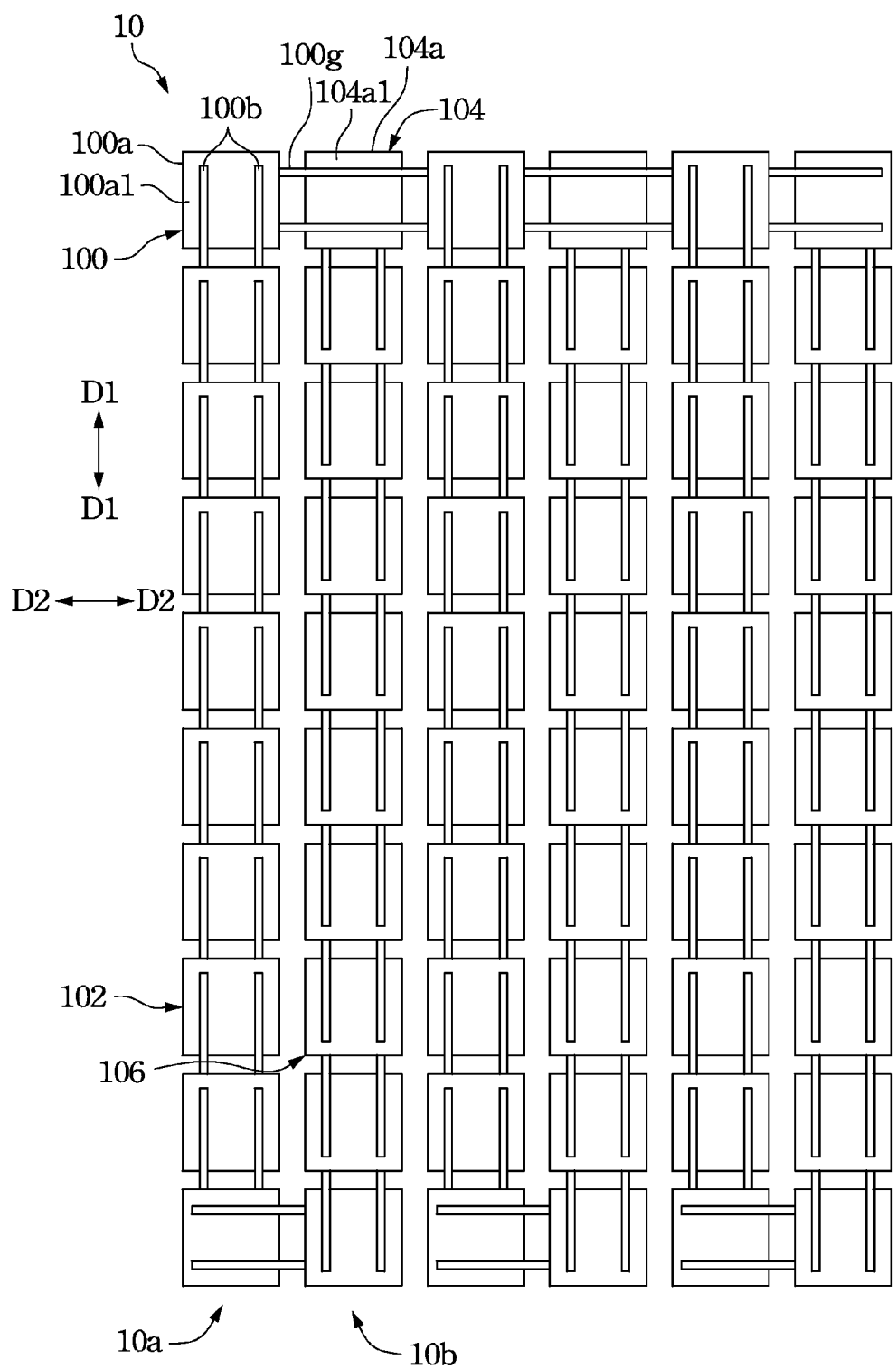
FIG. 2 is a schematic diagram of a solar cell module in FIG. 1.
Figure 3:
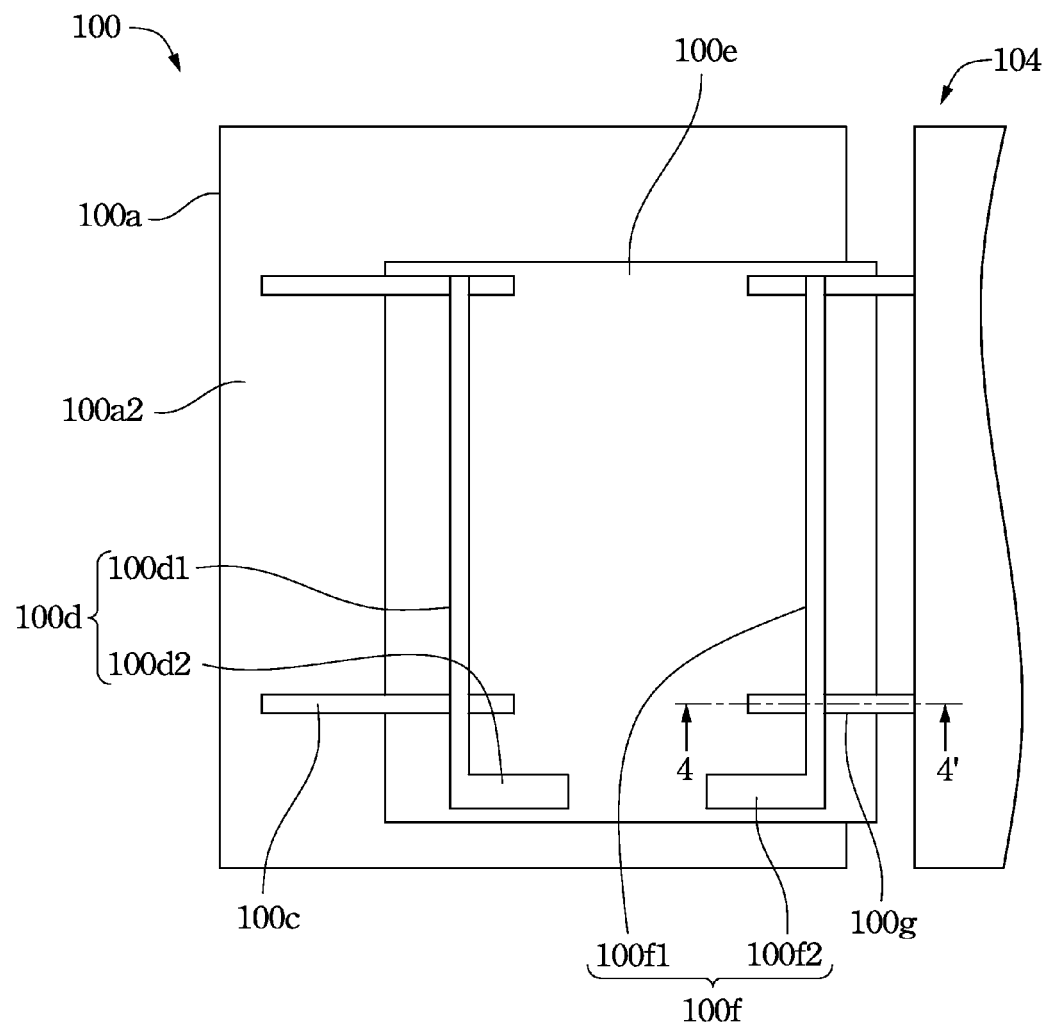
FIG. 3 is a partial schematic diagram of an embodiment of a first bridging solar cell and a second bridging solar cell in FIG. 2.
Figure 4:
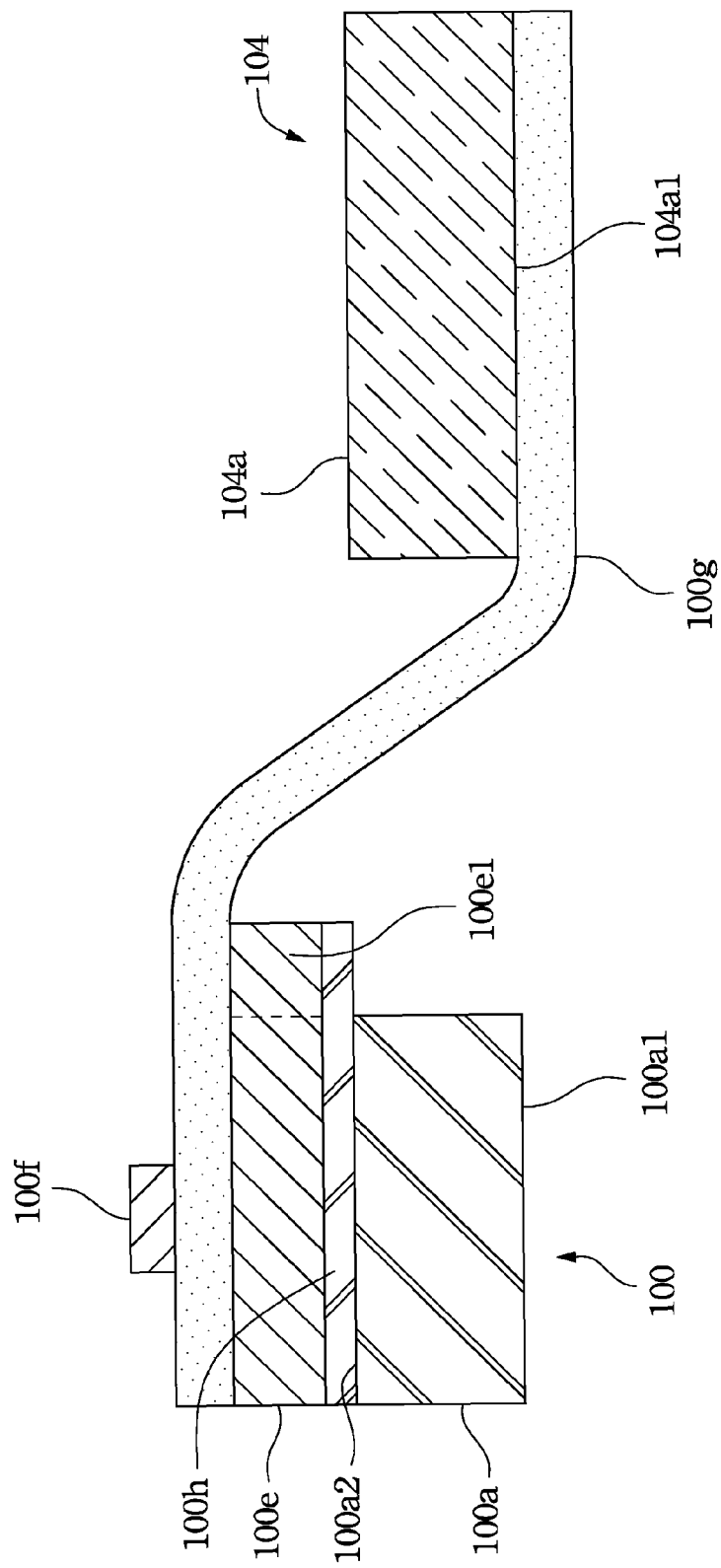
FIG. 4 is a partial sectional view of the first bridging solar cell and the second bridging solar cell along line 4-4' in FIG. 3.

FIG. 2 is a schematic diagram of a solar cell module 10 in FIG. 1. FIG. 3 is a partial schematic diagram of an embodiment of a first bridging solar cell 100 and a second bridging solar cell 104 in FIG. 2. FIG. 4 is a partial sectional view of the first bridging solar cell 100 and the second bridging solar cell 104 along line 4-4' in FIG. 3.

As shown in FIG. 2, FIG. 3, and FIG. 4, each of the solar cell modules 10 includes a first solar cell string 10a. The first solar cell string 10a of the solar cell module 10 includes a plurality of first solar cells 102 and at least one first bridging solar cell 100 (the first solar cell string 10a includes only one first bridging solar cell 100 in this embodiment). The first solar cells 102 of the first solar cell string 10a are electrically connected in series along a first direction D1, and the first bridging solar cell 100 is electrically connected to an end of the first solar cells 102 (i.e., the upper end of the first solar cells 102 shown in FIG. 2). The first bridging solar cell 100 of the solar cell module 10 includes a substrate 100a, a first set of bus bar electrodes 100b, a second set of bus bar electrodes 100c, a first welding member 100d, a first insulation film 100e, a third set of bus bar electrodes 100g, and a second welding member 100f. The substrate 100a of the first bridging solar cell 100 has a front surface 100a1 and a back surface 100a2. The first set of bus bar electrodes 100b of the first bridging solar cell 100 is disposed on the front surface 100a1 of the substrate 100a along the first direction D1. The second set of bus bar electrodes 100c of the first bridging solar cell 100 is disposed on the back surface 100a2 of the substrate 100a along a second direction D2 different from the first direction D1, and is electrically connected to the first set of bus bar electrodes 100b via the substrate 100a. In the embodiment of the disclosure, the first direction D1 is perpendicular to the second direction D2, but the disclosure is not limited in this regard.

It should be pointed out that the reason why the substrate 100a of the first bridging solar cell 100 can electrically interconnect the first set of bus bar electrodes 100b and the second set of bus bar electrodes 100c is that the substrate 100a includes an N-type semiconductor layer and a P-type semiconductor layer (not shown). In an embodiment of the disclosure, the N-type semiconductor layer of the substrate 100a is electrically connected to the first set of bus bar electrodes 100b, and the P-type semiconductor layer of the substrate 100 is electrically connected to the second set of bus bar electrodes 100c. The N-type semiconductor layer of the substrate 100 can be stimulated to emit free electrons after receiving light. Due to the potential difference, the free electrons flow to holes in the P-type semiconductor layer, thereby generating a current and thus electrically interconnecting the first set of bus bar electrodes 100b and the second set of bus bar electrodes 100c.

The first welding member 100d of the first bridging solar cell 100 is electrically connected to the second set of bus bar electrodes 100c. The first insulation film 100e of the first bridging solar cell 100 is disposed on the back surface 100a2 of the substrate 100a. The third set of bus bar electrodes 100g of the first bridging solar cell 100 is disposed on the first insulation film 100e along the second direction D2 so as to be insulated from the substrate 100a. The second welding member 100f of the first bridging solar cell 100 is disposed on the first insulation film 100e and electrically connected to the third set of bus bar electrodes 100g.

As shown in FIG. 3, the first welding member 100d of the first bridging solar cell 100 includes a coupling portion 100d1 and a terminal portion 100d2. The coupling portion 100d1 of the first welding member 100d is coupled to the second set of bus bar electrodes 100c. The terminal portion 100d2 of the first welding member 100d is connected to the coupling portion 100d1. The coupling portion 100d1 and the terminal portion 100d2 of the first welding member 100d form an L-shaped structure, but the invention is not limited in this regard. Similarly, the second welding member 100f of the first bridging solar cell 100 includes a coupling portion 100f1 and a terminal portion 100f2. The coupling portion 100f1 of the second welding member 100f is coupled to the third set of bus bar electrodes 100g. The terminal portion 100f2 of the second welding member 100f is connected to the coupling portion 100f1. The coupling portion 100f1 and the terminal portion 100f2 of the second welding member 100f form an L-shaped structure. With this configuration, the junction box 108 of the solar cell module 10 can be electrically connected to the terminal portion 100d2 of the first welding member 100d and the terminal portion 100f2 of the second welding member 100f, thereby electrically connecting to another junction box 108 of another adjacent solar cell module 10.

As shown in FIG. 2, FIG. 3, and FIG. 4, each of the solar cell modules 10 further includes a second solar cell string 10b. The second solar cell string 10b of the solar cell module 10 includes a plurality of second solar cells 106 and at least one second bridging solar cell 104 (the second solar cell string 10b includes only one second bridging solar cell 104 in this embodiment). The second solar cells 106 of the second solar cell string 10b are electrically connected in series along the first direction D1, and the second bridging solar cell 104 is electrically connected to an end of the second solar cells 106 (i.e., the upper end of the second solar cells 106 shown in FIG. 2). The second bridging solar cell 104 of the second solar cell string 10b includes a substrate 104a. The substrate 104a of the second bridging solar cell 104 has a front surface 104a1. The third set of bus bar electrodes 100g of the first bridging solar cell 100 is extended onto the front surface 104a1 of the substrate 104a of the second bridging solar cell 104 from the back surface 100a2 of the substrate 100a. Therefore, when the first solar cell string 10a and the second solar cell string 10b of the solar cell module 10 are electrically connected to each other, the third set of bus bar electrodes 100g of the first bridging solar cell 100 that is located on the back surface 100a2 of the substrate 100a are directly extended onto the another front surface 104a1 of the second bridging solar cell 104 of the second solar cell string 10*b* and act as the bus bar electrodes on the front surface 104*a*1 of the second bridging solar cell 104.

In other words, the third set of bus bar electrodes 100*g* is shared by the first bridging solar cell 100 and the second bridging solar cell 104, and is electrically connected to the back surface 100*a*2 of the substrate 100*a* of the first bridging solar cell 100 and the front surface 104*a*1 of the substrate 104*a* of the second bridging solar cell 104. Although the third set of bus bar electrodes 100*g* is described as a component included in the first bridging solar cell 100 above, the third set of bus bar electrodes 100*g* can also be regarded as a component included in the second bridging solar cell 104.

It can be seen that the solar energy system 1 of the disclosure does not need to utilize a region adjacent to an upper edge and a region adjacent to a lower edge of a glass substrate (not shown) of each of the solar cell modules 10 for electrical connection by using bussing ribbons. Accordingly, not only can the total area of the glass substrates of the solar cell modules 10 be reduced, but the total length of the bussing ribbons used in the solar cell modules 10 can also be reduced, so as to achieve the advantages of saving costs of related materials and reducing energy loss. For example, because bussing ribbons need to be installed in the regions respectively adjacent to the upper and lower edges of a glass substrate of a conventional solar cell module, the length and width of the glass substrate of the conventional solar cell module are respectively 1668 mm and 1000 mm. In contrast, bussing ribbons for electrical connection are unnecessary in the solar cell module 10 of the disclosure, and so the length and width of the glass substrate used in the solar cell module 10 can be reduced to 1611 mm and 983 mm respectively.

As shown in FIG. 4, the first bridging solar cell 100 of the first solar cell string 10*a* further includes a packaging member 100*h* adhered under the first insulation film 100*e* and located between the first insulation film 100*e* and the back surface 100*a*2 of the substrate 100*a*. The first insulation film 100*e* of the first bridging solar cell 100 has a protruding portion 100*e*1. The protruding portion 100*e*1 of the first insulation film 100*e* protrudes outwardly from an edge of the back surface 100*a*2 of the substrate 100*a*. The third set of bus bar electrodes 100*g* of the first bridging solar cell 100 is extended away from the first insulation film 100*e* from the protruding portion 100*e*1, and is extended onto the front surface 104*a*1 of the substrate 104*a* of the second bridging solar cell 104. Accordingly, the third set of bus bar electrodes 100*g* are prevented from directly contacting the substrate 100*a* by the protruding portion 100*e*1 of the first insulation film 100*e*, thereby preventing the third set of bus bar electrodes 100*g* from being electrically connected to the substrate 100*a*.

In an embodiment of the disclosure, the junction boxes 108 of each of the solar cell modules 10 are disposed on the back surface 100*a*2 of the substrate 100*a* of the first bridging solar cell 100, but the disclosure is not limited in this regard.

Figure 5:
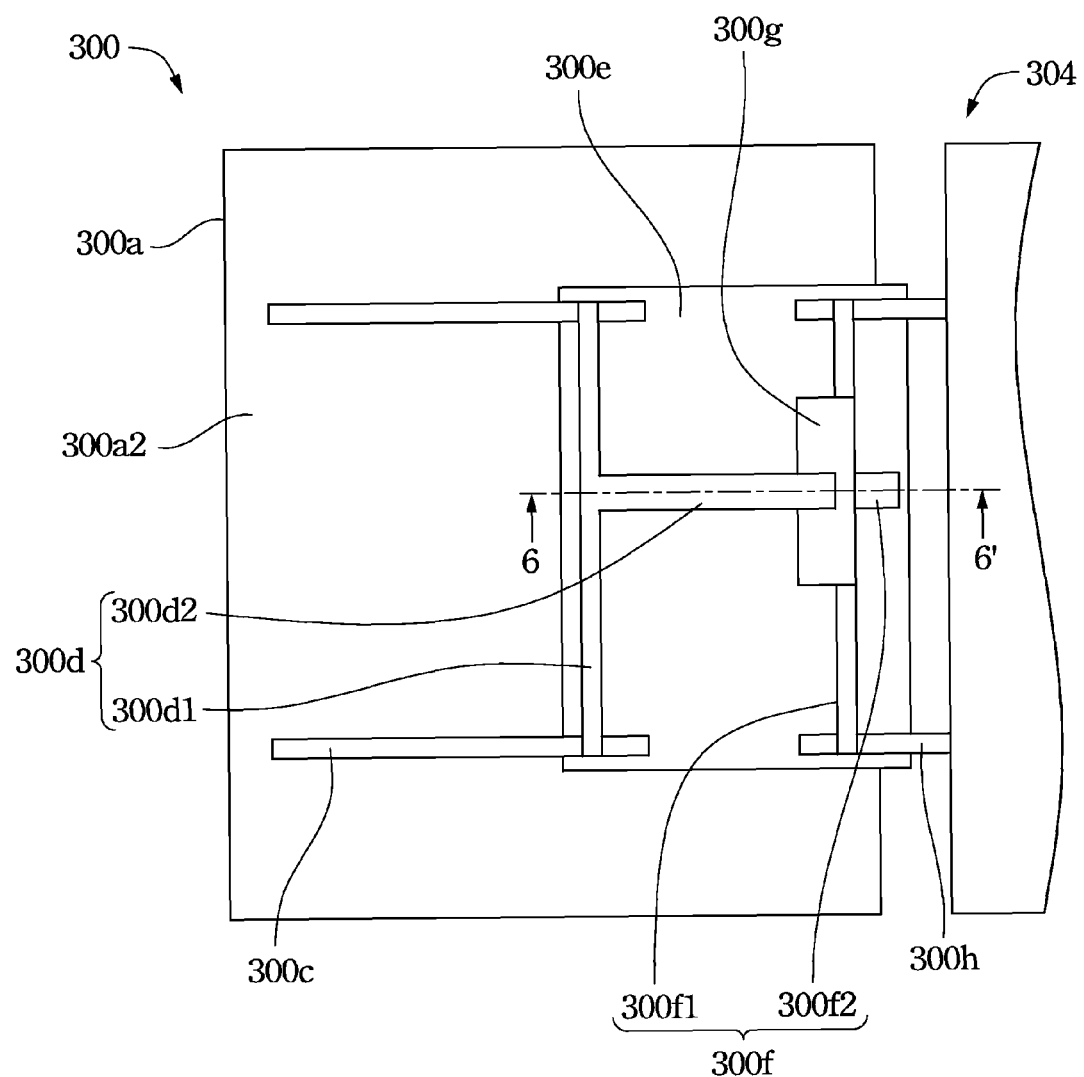
FIG. 5 is a partial schematic diagram of a first bridging solar cell and a second bridging solar cell according to another embodiment of the disclosure.
Figure 6:
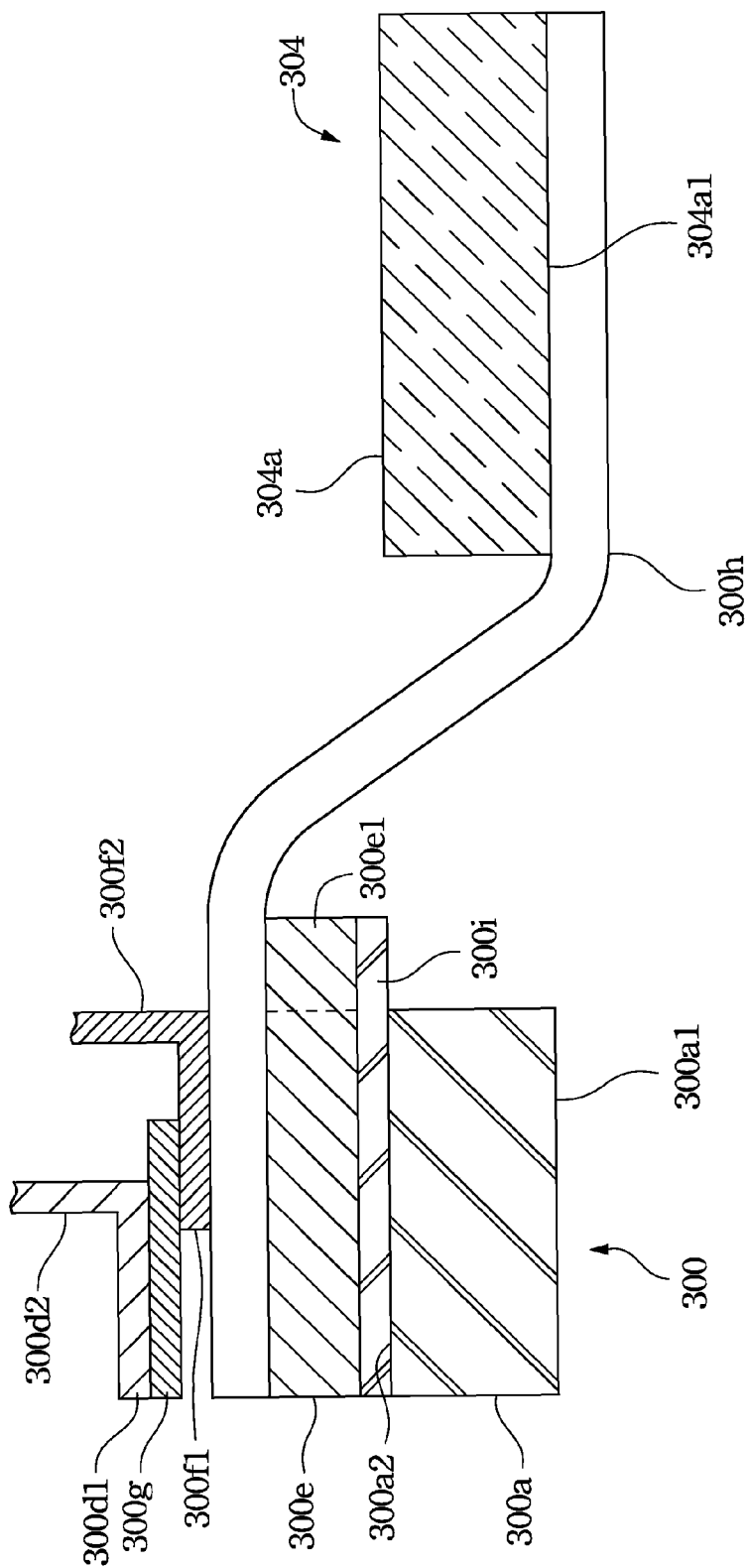
FIG. 6 is a partial sectional view of the first bridging solar cell and the second bridging solar cell along line 6-6' in FIG. 5.

FIG. 5 is a partial schematic diagram of a first bridging solar cell 300 and a second bridging solar cell 304 according to another embodiment of the disclosure. FIG. 6 is a partial sectional view of the first bridging solar cell 300 and the second bridging solar cell 304 along line 6-6' in FIG. 5.

As shown in FIG. 5 and FIG. 6, the first bridging solar cell 300 includes a substrate 300*a*, a first set of bus bar electrodes (see FIG. 2), a second set of bus bar electrodes 300*c*, a first welding member 300*d*, a first insulation film 300*e*, a third set of bus bar electrodes 300*h*, a second welding member 300*f*, and a packaging member 300*i*. The first set of bus bar electrodes of the first bridging solar cell 300 is disposed on a front surface 300*a*1 of the substrate 300*a* along the first direction D1 (see FIG. 2). The second set of bus bar electrodes 300*c* of the first bridging solar cell 300 is disposed on a back surface 300*a*2 of the substrate 300*a* along the second direction D2 different from the first direction D1 and electrically connected to the first set of bus bar electrodes via the substrate 300*a* (see FIG. 2). The first welding member 300*d* of the first bridging solar cell 300 is electrically connected to the second set of bus bar electrodes 300*c*. The first insulation film 300*e* of the first bridging solar cell 300 is disposed on the back surface 300*a*2 of the substrate 300*a*. The third set of bus bar electrodes 300*h* of the first bridging solar cell 300 is disposed on the first insulation film 300*e* along the second direction D2 so as to be insulated from the substrate 300*a*. The packaging member 300*i* of the first bridging solar cell 300 is adhered under the first insulation film 300*e* and located between the first insulation film 300*e* and the back surface 300*a*2 of the substrate 300*a*. The first insulation film 300*e* of the first bridging solar cell 300 has a protruding portion 300*e*1. The protruding portion 300*e*1 of the first insulation film 300*e* protrudes outwardly from an edge of the back surface 300*a*2 of the substrate 300*a*. The third set of bus bar electrodes 300*h* of the first bridging solar cell 300 is extended away from the first insulation film 300*e* from the protruding portion 300*e*1, and is extended onto a front surface 304*a*1 of a substrate 304*a* of the second bridging solar cell 304.

Accordingly, the first bridging solar cell 300 can prevent the third set of bus bar electrodes 300*h* from directly contacting the substrate 300*a* by the protruding portion 300*e*1 of the first insulation film 300*e*, thereby preventing the third set of bus bar electrodes 300*h* from being electrically connected to the substrate 300*a*. The second welding member 300*f* of the first bridging solar cell 300 is disposed on the first insulation film 300*e* and electrically connected to the third set of bus bar electrodes 300*h*.

As shown in FIG. 5, the first welding member 300*d* of the first bridging solar cell 300 includes a coupling portion 300*d*1 and a terminal portion 300*d*2. The coupling portion 300*d*1 of the first welding member 300*d* is coupled to the second set of bus bar electrodes 300*c*. The terminal portion 300*d*2 of the first welding member 300*d* is connected to the coupling portion 300*d*1. The coupling portion 300*d*1 and the terminal portion 300*d*2 of the first welding member 300*d* form a T-shaped structure, but the invention is not limited in this regard. Similarly, the second welding member 300*f* of the first bridging solar cell 300 includes a coupling portion 300*f*1 and a terminal portion 300*f*2. The coupling portion 300*f*1 of the second welding member 300*f* is coupled to the third set of bus bar electrodes 300*h*. The terminal portion 300*f*2 of the second welding member 300*f* is connected to the coupling portion 300*f*1. The coupling portion 300*f*1 and the terminal portion 300*f*2 of the second welding member 300*f* form a T-shaped structure. Therefore, the junction box 108 of the solar cell module 10 can be electrically connected to the terminal portion 300*d*2 of the first welding member 300*d* and the terminal portion 300*f*2 of the second welding member 300*f*, thereby electrically connecting to another junction box 108 of another adjacent solar cell module 10.

It should be pointed out that assembly workers pass the terminal portion 300*d*2 of the first welding member 300*d* and the terminal portion 300*f*2 of the second welding member 300*f* through a back sheet (not shown) before electrically connecting to the junction box 108. As shown in FIG. 5, the terminal portion 300*d*2 of the first welding member 300*d* and the terminal portion 300*f*2 of the second welding member 300*f* face the same direction (i.e., to the right in FIG. 5). In contrast, as shown in FIG. 3, the terminal portion 100*d*2 of the first welding member 100*d* and the terminal portion 100*f*2 of the second welding member 100f face different directions (i.e., the terminal portion 100d2 faces the right and the terminal portion 100f2 faces the left in FIG. 3). Compared with the embodiment in FIG. 3, assembly workers can realize smoother assembly during the process of passing the terminal portion 300d2 and the terminal portion 300f2 through the back sheet due to the fact that these elements face the same direction, as described above. In other words, the advantage of the terminal portion 300d2 and the terminal portion 300f2 facing the same direction is that convenience during assembly may be realized.

Furthermore, in the embodiment of the disclosure, the first bridging solar cell 300 further includes a second insulation film 300g. The second insulation film 300g of the first bridging solar cell 300 is disposed on the first insulation film 300e and covers a portion of the second welding member 300f (the central part of the coupling portion 300f1 of the second welding member 300f in FIG. 5). A portion of the first welding member 300d (the end part of the terminal portion 300d2 of the first welding member 300d in FIG. 5) of the first bridging solar cell 300 is extended onto the second insulation film 300g and insulated from the second welding member 300f by the second insulation film 300g. Furthermore, the portion of the first welding member 300d of the first bridging solar cell 300 extended onto the second insulation film 300g (i.e., the end part of the terminal portion 300d2 of the first welding member 300d in FIG. 5) and the portion of the second welding member 300f covered by the second insulation film 300g (i.e., the central part of the coupling portion 300f1 of the second welding member 300f in FIG. 5) are respectively located at two opposite surfaces of the second insulation film 300g. With the foregoing layout, the distance between the terminal portion 300d2 of the first welding member 300d and the terminal portion 300f2 of the second welding member 300f can be reduced. Therefore, each of the solar cell modules 10 in the solar energy system 1 of the disclosure can adopt small-sized junction boxes, thereby reducing the overall costs of the solar energy system 1.

In another embodiment of the disclosure, the foregoing second insulation film 300g can be omitted from the configuration of the first bridging solar cell 300. As long as the terminal portion 300d2 of the first welding member 300d does not contact the terminal portion 300f2 of the second welding member 300, the purpose of adopting small-sized junction boxes 108 can also be achieved by appropriately adjusting the shapes of the terminal portion 300d2 and the terminal portion 300f2 to reduce the distance between the terminal portion 300d2 and the terminal portion 300f2.

According to the foregoing recitations of the embodiments of the disclosure, it can be seen that a bridging solar cell used in a solar energy system is such that the direction along which bus bar electrodes are disposed on a back surface (which is referred to also as a shadow-side surface in the disclosure) of the bridging solar cell is different from the direction along which bus bar electrodes are disposed on a front surface (which is referred to also as an incident light-side surface in the disclosure) of the bridging solar cell (e.g., the direction along which two sets of bus bar electrodes are disposed on the back surface of a bridging solar cell is made to be perpendicular to the direction along which the bus bar electrodes are disposed on the front surface of the bridging solar cell). Therefore, one set of bus bar electrodes on the back surface of a bridging solar cell of a solar cell string of a solar cell module can be directly extended onto a front surface of another bridging solar cell in another solar cell string of the solar cell module and act as the bus bar electrodes on the front surface of the another bridging solar cell when the solar cell strings are made to be electrically connected in series. Moreover, another set of bus bar electrodes on the back surface of the bridging solar cell of the solar cell string of the solar cell module can be electrically connected to another bridging solar cell in another solar cell module by using welding members and a junction box. Accordingly, not only can the area of the glass substrate of the solar cell module be reduced, but the total length of the used bussing ribbons in the solar cell module can also be reduced, so as to achieve the advantages of saving costs of related materials and minimizing energy loss.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A bridging solar cell comprising:
   a substrate having a front surface and a back surface;
   a first set of bus bar electrodes disposed on the front surface and extending along a first direction;
   a second set of bus bar electrodes disposed on the back surface and extending along a second direction different from the first direction and electrically connected to the first set of bus bar electrodes via the substrate;
   a first insulation film disposed on the back surface between a portion of the second set of bus bar electrodes and the back surface;
   a first welding member disposed on the first insulation film and electrically connected to the second set of bus bar electrodes;
   a third set of bus bar electrodes disposed on the first insulation film and extending along the second direction so as to be insulated from the substrate; and
   a second welding member disposed on the first insulation film and electrically connected to the third set of bus bar electrodes.

2. The bridging solar cell of claim 1, further comprising a second insulation film disposed on the first insulation film and covering a portion of the second welding member, wherein a portion of the first welding member is further extended onto the second insulation film, and the second insulation film is located between the portion of the first welding member and the portion of the second welding member, so that the first welding member is insulated from the second welding member by the second insulation film.

3. The bridging solar cell of claim 2, wherein the portion of the first welding member extended onto the second insulation film and the portion of the second welding member covered by the second insulation film are respectively located at two opposite surfaces of the second insulation film.

4. The bridging solar cell of claim 1, wherein the first insulation film has a protruding portion protruding outwardly from an edge of the back surface, and the third set of bus bar electrodes is extended away from the first insulation film from the protruding portion.

5. The bridging solar cell of claim 1, wherein the first welding member comprises:
   a coupling portion coupled to the second set of bus bar electrodes; and
   a terminal portion connected to the coupling portion, wherein the coupling portion and the terminal portion form an L-shaped structure or a T-shaped structure.

6. The bridging solar cell of claim 1, wherein the second welding member comprises:

a coupling portion coupled to the third set of bus bar electrodes; and a terminal portion connected to the coupling portion, wherein the coupling portion and the terminal portion form an L-shaped structure or a T-shaped structure.

7. A solar energy system comprising a plurality of solar cell modules, wherein each of the solar cell modules comprises:

a first solar cell string comprising a plurality of first solar cells and a first bridging solar cell that are connected in series along a first direction, wherein the first bridging solar cell comprises:

a substrate having a front surface and a back surface;

a first set of bus bar electrodes disposed on the front surface and extending along the first direction;

a second set of bus bar electrodes disposed on the back surface and extending along a second direction different from the first direction and electrically connected to the first set of bus bar electrodes via the substrate;

a first insulation film disposed on the back surface between a portion of the second set of bus bar electrodes and the back surface;

a first welding member disposed on the first insulation film and electrically connected to the second set of bus bar electrodes;

a third set of bus bar electrodes disposed on the first insulation film along the second direction so as to be insulated from the substrate; and a second welding member disposed on the first insulation film and electrically connected to the third set of bus bar electrodes; and a junction box electrically connected to the first welding member and the second welding member;

wherein the junction box of each of the solar cell modules is electrically connected to another junction box of another adjacent solar cell module.

8. The solar energy system of claim 7, wherein each of the solar cell modules further comprises a second solar cell string, the second solar cell string comprises a plurality of second solar cells and a second bridging solar cell that are connected in series, the second bridging solar cell comprises a substrate, the substrate of the second bridging solar cell has a front surface, and the third set of bus bar electrodes is extended onto the front surface of the substrate of the second bridging solar cell.

9. The solar energy system of claim 7, further comprising a second insulation film disposed on the first insulation film and covering a portion of the second welding member, wherein a portion of the first welding member is further extended onto the second insulation film, and the second insulation film is located between the portion of the first welding member and the portion of the second welding member, so that the first welding member is insulated from the second welding member by the second insulation film.

10. The solar energy system of claim 9, wherein the portion of the first welding member extended onto the second insulation film and the portion of the second welding member covered by the second insulation film are respectively located at two opposite surfaces of the second insulation film.

11. The solar energy system of claim 7, wherein the first insulation film has a protruding portion protruding outwardly from an edge of the back surface, and the third set of bus bar electrodes is extended away from the first insulation film from the protruding portion.

12. The solar energy system of claim 7, wherein the first welding member comprises:

a coupling portion coupled to the second set of bus bar electrodes; and a terminal portion connected to the coupling portion, wherein the coupling portion and the terminal portion form an L-shaped structure or a T-shaped structure.

13. The solar energy system of claim 7, wherein the second welding member comprises:

a coupling portion coupled to the third set of bus bar electrodes; and a terminal portion connected to the coupling portion, wherein the coupling portion and the terminal portion form an L-shaped structure or a T-shaped structure.

14. The solar energy system of claim 7, wherein the junction box is disposed on the back surface.

* * * * *